United States Patent [19]
Losehand

[11] 4,089,023
[45] May 9, 1978

[54] TWO-PHASE CHARGE-COUPLED SEMICONDUCTOR ARRANGEMENT

[75] Inventor: Reinhard Losehand, Munich, Germany

[73] Assignee: Siemens Aktiengesellschaft, Berlin & Munich, Germany

[21] Appl. No.: 703,535

[22] Filed: Jul. 8, 1976

[30] Foreign Application Priority Data

Jul. 22, 1975 Germany .............................. 2532789

[51] Int. Cl.² ..................... H01L 29/78; H01L 29/04; G11C 19/28
[52] U.S. Cl. ....................................... 357/24; 357/59; 307/221 D
[58] Field of Search ................. 357/24, 59; 307/221 D

[56] References Cited

U.S. PATENT DOCUMENTS

| 3,728,590 | 4/1973 | Kim et al. | 357/24 |
| 3,735,156 | 5/1973 | Krambeck et al. | 357/24 |
| 3,932,882 | 1/1976 | Berger | 357/24 |

OTHER PUBLICATIONS

Sequin "Experimental Investigation of a Linear 500—Element 3–Phase Charge–Coupled Device" Bell System Tech. Journal, vol. 53 (4/74) pp. 581–610.

Primary Examiner—William D. Larkins
Assistant Examiner—Gene M. Munson
Attorney, Agent, or Firm—Hill, Gross, Simpson, Van Santen, Steadman, Chiara & Simpson

[57] ABSTRACT

A three-phase charge-coupled device comprising three successions of electrodes formed on an insulating layer covering one surface of a semiconductor substrate. In effect, this provides a linear array of closely spaced MOS (metal-oxide-semiconductor) capacitors. Each succession makes up one phase of the CCD. Thus, each third electrode in the linear array makes up one succession. The electrodes of two phases are interconnected by way of a conductor path to all of the electrodes of their respective group, but the electrodes of the third phase are coupled by a high resistance layer to the electrodes of the other two phases and to the substrate via the capacitance formed by each electrode of the third phase, the insulation layer and the substrate. One electrode of each succession forms a group below which an asymmetric potential well may be produced in the substrate.

4 Claims, 4 Drawing Figures

TWO-PHASE CHARGE-COUPLED SEMICONDUCTOR ARRANGEMENT

BACKGROUND OF THE INVENTION

The invention relates to a charge-coupled semiconductor arrangement with a substrate made of semiconductor material, whereby an insulator layer is applied onto one of its surfaces, with three successions of electrodes thereupon, whereby one electrode of each succession, respectively, form a group below which an asymmetric potential well may be produced in the substrate.

Such semiconductor arrangements have already been developed. In such a semiconductor arrangement, the electrodes are conducted among one another in a succession. In the case of three successions, this means that three different "connection circuits" must be provided which are electrically insulated from one another. If, in the case of such a semiconductor arrangement, all electric connections are directly provided upon the insulator layer in the form of conductor paths, these electric connections must be separated from one another by further insulator layers. This causes a difficult design problem, since several photo-lacquer steps and etching steps are required in order to produce the desired structure of the conductor paths.

It is an object of the present invention to provide a charge coupled semiconductor arrangement with three electrode successions which has a simpler electrode design arrangement than has been employed in the prior art and provides a much simpler wiring arrangement.

BRIEF SUMMARY OF THE INVENTION

The present invention provides a thre-phase charge-coupled device in which only two successions of electrodes are interconnected, while the third succession of electrodes is coupled to the other two successions by way of a layer of high resistance and capacitatively to the substrate through the capacitors formed by the electrodes of the third succession formed on the insulating layer covering the substrate. The charge-coupled device comprises preferably a silicon substrate, while the resistance layer is preferably silicon oxide (SiO), or Silicon (Si), or Gallium arsenide (GaAs), or antimony sulfide ($Sb_2S_3$). The resistance value of the resistance layer may be adjusted by appropriate doping.

BRIEF DESCRIPTION OF THE DRAWINGS

The invention is explained in more detail in the following with the help of the drawing, wherein there is shown.

DESCRIPTION OF THE PREFERRED EMBODIMENTS

Figure 1:
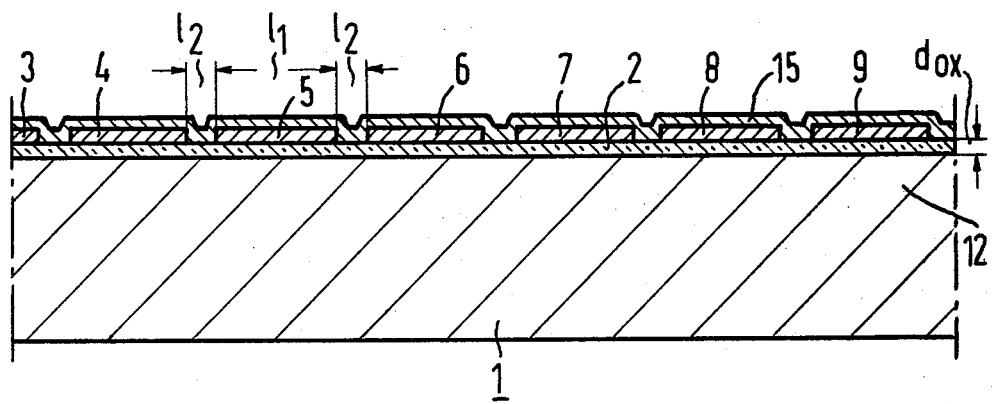
FIG. 1 is a section through a semiconductor arrangement in accordance with the invention (section I—I through FIG. 2)

An insulator layer 2 is provided on a semiconductor substrate 1, as shown in FIG. 1. The semiconductor substrate 1 consists of Si, while the insulator layer 2 is silicon dioxide. Metal electrodes 4, 5, 6, 7 and 8 are positioned upon the insulator layer 2. As it has been shown in FIG. 2, the electrodes 5 and 8 are conductively interconnected by way of a conductor path 10 upon the insulator layer 2. Furthermore, the electrodes 3, 6 and 9 are conductively interconnected by way of a conductor path 11. The electrodes 4 and 7 are not connected to any conductor path. They are coupled with one another via a high resistance layer 15 and to the semiconductor substrate 1 via the capacitors formed by the electrodes, the insulating layer and the substrate. The electrodes 5 and 8 form a first succession. The electrodes 3, 6 and 9 form a second succession. The electrodes 4 and 7 form a third succession. When the electrodes of the first and the second successions are subjected to high-frequency voltage fluctuations, the potential $V_3$ of the first succession is stabilized to the time mean value $$\overline{V}_3 = \frac{1}{2T} \int_0^T (V_1 + V_2) dt$$

of the voltages $V_1$ and $V_2$ at the first and the second successions. In the case of lower frequency, the potential of the first succession follows the mean value of the two voltages:

$$V_3 = (V_1 + V_2)/2.$$

Figure 2:
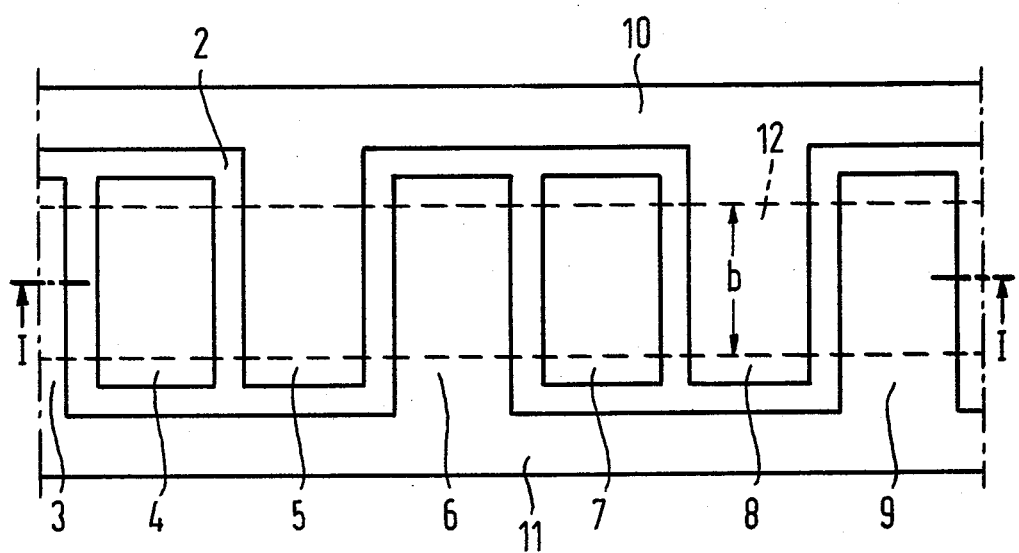
FIG. 2 is a plan view of the semiconductor arrangement of FIG. 1 with the resistance layer left out.

The width $b$ of the charge-transport channel (transport channel) is indicated in FIG. 2, below the electrodes, by way of broken lines 12. This width $b$ can be fixed by a "channel-stop-diffusion" or thick oxide insulation. The resistance layer 15 is evaporated over the entire structure of FIG. 2.

In the following, the operation of the semiconductor arrangement in accordance with the invention is explained in more detail with the help of FIG. 3, wherein a linear CCD is shown. The charge storage is effected directly below the electrode succession which has the highest voltage with respect to the semiconductor substrate 1. In the static case, this will be the first and the second succession which have also respectively been denoted by $E_1$ and $E_2$. A charge transport is effected in such a way that the respective voltages $$V_1 = V_0 + V_A \sin \omega t, \text{ and}$$

$$V_2 = V_0 + V_A \sin (\omega t, \psi)$$

are applied to the electrodes of the successions $E_1$ and $E_2$, whereby $V_O$ = constant voltage
$V_A$ = constant amplitude
$\omega$ = circuit frequency and
$\psi$ = phase angle.

The sine-shaped path may also be replaced by a rectangular or trapezoid impulse shape. In the case of a sufficiently high frequency, the direct voltage $V_3 = V_0$ will be given at the third succession, which is also denoted by $E_3$.

Figure 3:
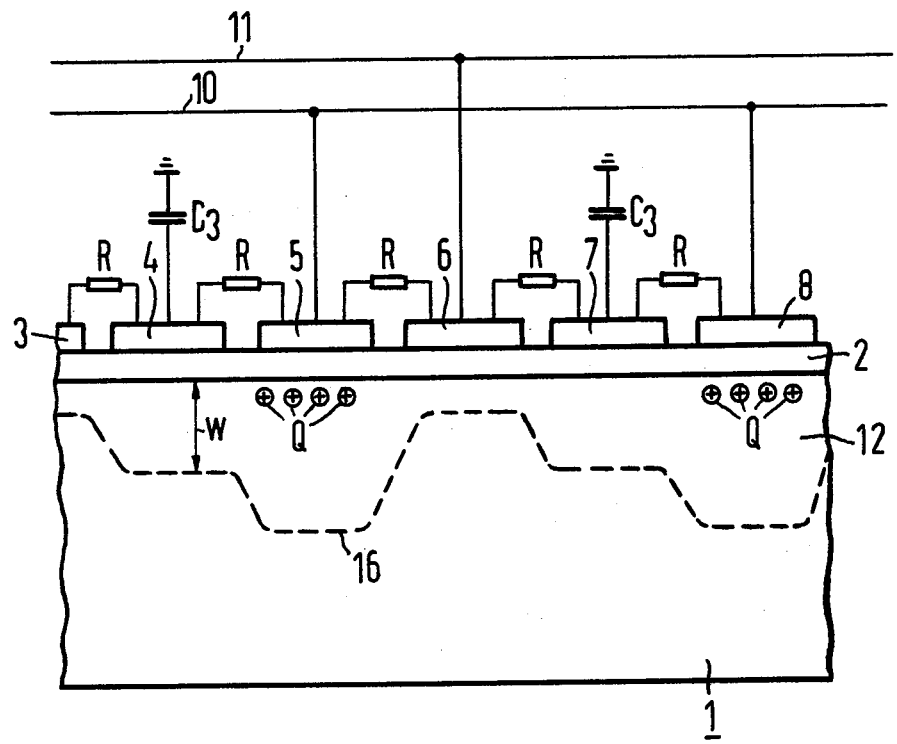
FIG. 3 is a diagram for explaining the operation of the semiconductor arrangement in accordance with the invention.

The resistance layer 15 in FIG. 3 has been schematically indicated by resistances R and capacitors $C_3$.

Figure 4:
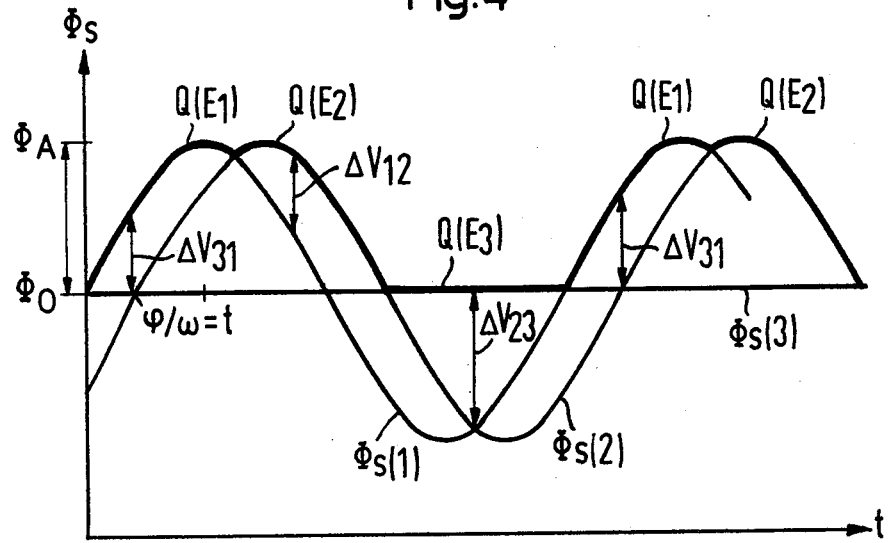
FIG. 4 is the potential curve at the boundary surface of the interface between the substrate and the insulating layer.

The potential path $\phi_s$ at the boundary surface insulator layer 2-substrate 1, in FIG. 4, has been shown, depending on time $t$, whereby the following was assumed for simplification purposes:

$$\phi_{x(1)} = -V_1$$

$$\phi_{x(2)} = -V_2$$

$$\phi_{x(3)} = -V_3$$

with (1), (2), (3) = index pointing out the respective successions $E_1$, $E_2$ and $E_3$.

In the case of an n-conductive semiconductor substrate 1, the stored charge consists of defect electrons which collect at the points of highest potential. The applied voltage must be negative, i.e., $$V_0 = -|V_0|,$$

so that $$\phi_{x(1)} = + |V_0| + V_A \sin \Omega t,$$

$$\phi_{x(2)} = + |V_0| + V_A \sin (\Omega t - \psi), \text{ and}$$

$$\phi_{x(3)} = + |V_0|$$

results, whereby $\phi_o$ has been assumed to be $-V_0$ and $\phi_A$ to be $-V_A$.

The charge Q will be processed from the succession $E_1$ to the succession $E_2$, from the latter to the succession $E_3$ then again to the succession $E_1$, which has been indicated in FIG. 4 by the thickly drawn curve portion, and by $Q(E_1)$, $Q(E_2)$, and $Q(E_3)$.

In FIG. 3, a state has been indicated by broken lines 16 (depth W), where the charge Q indicated by $\oplus$ is essentially positioned below the succession $E_1$ since a higher voltage appears on conductor path 10 than on conductor path 11, at this moment.

Due to the geometric arrangement of the electrode successions $E_1$, $E_2$ and $E_3$ (compare FIG. 1 through 3), the charge transfer means a transport of the charge along the electrodes, namely from left to right in FIGS. 1 through 3, since $< \psi < \pi$ was assumed. For $90 < \phi < 2\pi$, the charge transport in FIGS. 1 through 3 is effected from right to left.

The voltages $\Delta V_{31}$, $\Delta V_{12}$ and $\Delta V_{23}$ are the potential differences which cause the charge transfer.

When the CCD is imagined as a line of a two-dimensional picture-recording matrix which is sensed in accordance with a common television standard, the operation will subdivide as follows:

Storage time $2 \cdot 10^{-2}$ s. (static case),
Read-out time $10^{-4}$ s. (dynamic case),
Switch-over time $10^{-5}$ s.
Read-out frequency 10 MHz.

During the storage time the CCD remains static. The charge produced by the incident light is stored, for instance, below the succession $E_1$ (or $E_2$), whereby the remaining successions $E_2$, $E_3$ provide for the insulation due to a suitable selection of the voltages $V_2$, $V_3$. The voltage $V_1$ is selected in such a way that the maximum possible storage charge corresponds to the transport capacity. Thus, the prior known occurrence of the "blooming" due to over-exposure is prevented to a great extent.

The switching over of the voltages to transport conditions is effected within $10^{-5}$ s. Within this time, a voltage at the succession $E_3$ must be brought to the value suited for the transport by way of voltages $V_1$ and $V_2$, via the resistance layer 15. Hereafter, the charge is shifted with a transport frequency of approximately $10^7$ Hz, and is read out at the end of the chain. Thus, the conditions for the resistance value R (FIG. 3) of the resistance layer 15 are given.

The time constant $\tau$ of the succession $E_3$ $$\tau = R \cdot C_3$$

must be $$10^{-5} s > \tau > 10^{-7} s.$$

This causes the following dimensions (FIG. 1): $l_1 = 4$ µm; $l_2 = 2$ µm; $d_{ws} = 1$µm; $d_{ox} = 0.5$ µm, whereby the specific resistance of the semiconductor substrate 1 has the value 1 ohm-cm.

Thus, the specific resistance of the resistance layer is fixed to be $10^6 \Omega$ cm $> P > 10^4 \Omega$ cm.

Numerous semiconductor materials exist which fulfill these conditions and which may be easily evaporated, for instance, SiO, Si, GaAs, $Sb_2S_3$, etc.

The correct resistance value may thereby be adjusted by way of doping with foreign materials already during the evaporation process.

It will be apparent to those skilled in the art that many modifications and variations may be effected without departing from the spirit and scope of the novel concepts of the present invention.

I claim as my invention:

1. A semiconductor charge-coupled arrangement comprising a substrate of semiconductor material having an insulator layer formed on one surface thereof and three successions of electrodes formed on said insulator layer, one electrode of each succession respectively forming a group below which an asymmetric potential well is produced in the substrate, a conductor path interconnecting the electrodes of a first succession of electrodes, a second conductor path interconnecting the electrodes of a second succession of electrodes, said first and second successions of electrodes being the only successions in which the electrodes of such successions are connected together in their respective succession by a conductor path, a high resistance layer overlying the electrodes of all three successions, all three successions being coupled to each other by said high resistance layer and to said substrate by the capacitance formed by the respective electrodes with the insulating layer and the substrate.

2. A semiconductor arrangement in accordance with claim 1, in which the specific resistance of the resistance layer is between $10^6$ and $10^4 \Omega$ cm.

3. A semiconductor arrangement in accordance with claim 1, in which the resistance layer consists of doped SiO or Si or GaAs or $Sb_2S_3$.

4. A semiconductor arrangement in accordance with claim 1, in which the resistance value of the resistance layer can be adjusted by way of a corresponding doping.

* * * * *